(12) United States Patent
Hsieh et al.

(10) Patent No.: US 8,598,687 B2
(45) Date of Patent: Dec. 3, 2013

(54) SEMICONDUCTOR HAVING A HIGH ASPECT RATIO VIA

(75) Inventors: Yuan-Chih Hsieh, Hsinchu (TW); Richard Chu, Taipei (TW); Ming-Tung Wu, Hsinchu (TW); Martin Liu, Yonghe (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 13/481,574

(22) Filed: May 25, 2012

(65) Prior Publication Data
US 2012/0235300 A1    Sep. 20, 2012

Related U.S. Application Data

(63) Continuation of application No. 12/898,408, filed on Oct. 5, 2010, now Pat. No. 8,207,595.

(51) Int. Cl.
*H01L 29/40* (2006.01)
(52) U.S. Cl.
USPC ............ 257/621; 257/774; 257/E23.011

(58) Field of Classification Search
USPC .......... 257/414, 621, 774, E23.011, E23.067, 257/E23.145, E21.578
See application file for complete search history.

(56) References Cited

U.S. PATENT DOCUMENTS

| | | | |
|---|---|---|---|
| 5,608,264 A * | 3/1997 | Gaul | ............ 257/734 |
| 7,855,438 B2 | 12/2010 | Barth | |
| 8,110,489 B2 | 2/2012 | Ganguli et al. | |
| 8,207,595 B2 | 6/2012 | Hsieh et al. | |
| 2008/0067689 A1 * | 3/2008 | Barth | ............ 257/774 |
| 2012/0049299 A1 | 3/2012 | Chou | |
| 2012/0080761 A1 | 4/2012 | Hsieh et al. | |

* cited by examiner

*Primary Examiner* — Tucker Wright
(74) *Attorney, Agent, or Firm* — Haynes and Boone, LLP

(57) ABSTRACT

The present disclosure provides various embodiments of a via structure and method of manufacturing same. In an example, a via structure includes a via having via sidewall surfaces defined by a semiconductor substrate. The via sidewall surfaces have a first portion and a second portion. A conductive layer is disposed in the via on the first portion of the via sidewall surfaces, and a dielectric layer is disposed on the second portion of the via sidewall surfaces. The dielectric layer is disposed between the second portion of the via sidewall surfaces and the conductive layer. In an example, the dielectric layer is an oxide layer.

19 Claims, 6 Drawing Sheets

US 8,598,687 B2

SEMICONDUCTOR HAVING A HIGH ASPECT RATIO VIA

CROSS REFERENCE TO RELATED APPLICATION

This application is a continuation of U.S. patent application Ser. No. 12/898,408, filed Oct. 5, 2010, issued as U.S. Pat. No. 8,207,595, the entire disclosure of which is incorporated herein by reference. The present disclosure is also related to commonly-assigned U.S. patent application Ser. No. 13/481,550 entitled Semiconductor Having a High Aspect Ratio Via, filed May 25, 2012, the entire disclosure of which is incorporated herein by reference.

BACKGROUND

The present disclosure relates generally to semiconductor manufacturing. Specifically, the present disclosure relates to metallization of integrated circuit semiconductor devices. More specifically, the present disclosure relates to a semiconductor device having an improved high aspect ratio via and a method of fabricating the same.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a study topic that using current semiconductor technology develops more valuable ICs product. A complimentary metal oxide semiconductor (CMOS) microelectromechanical systems (MEMS) device happens to be a good candidate for that trend.

As is well understood in the art, semiconductor devices are typically formed using multiple layers of material, including conductive, semi-conductive, and insulative layers. To provide electrical conductivity between layers in a semiconductor device, a hole or via may be formed through certain layers. The via is then lined with a barrier layer, such as Ti, TiN, or Ti/TiN, and filled with an electrically conductive material, such as a metal, to provide electrical conductivity between the layers.

CMOS MEMS devices are very small electro-mechanical systems incorporated into CMOS semiconductor IC circuits. MEMS devices are a type of semiconductor device that use vias to provide electrical conductivity between layers of the device. One example of a MEMS device is a micro-inertial sensor. With an increase of via aspect ratio (e.g., via depth/size) due to ever shrinking geometries of semiconductor devices, it becomes more and more difficult to provide good step coverage of the barrier layer in the via.

If the barrier layer film coverage is not thick enough, the reactant gas (e.g., WF6) of a following wet-chemical vapor deposition (CVD) process will attack the via sidewall silicon and create defect problems for the via, such as voids or other open circuit issues. One reason for such problems is that low resistivity silicon wafers are conventionally used in MEMS device applications. Silicon allows for a native oxide to be easily formed in the via during the via hole etching process, especially along the via sidewalls. If the sidewall oxide can not be fully removed, it can block electrical signals from passing to and from the MEMS sensor, and thus rendering the device defective. Therefore, to solve one or more of the above mentioned issues, what is needed is an improved semiconductor device having an improved high aspect ratio via, and a method of fabrication for the same.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6-11 show a via area, (shown as block A of FIG. 5), as an enlarged view of the via to show details.

DETAILED DESCRIPTION

Figure 1:
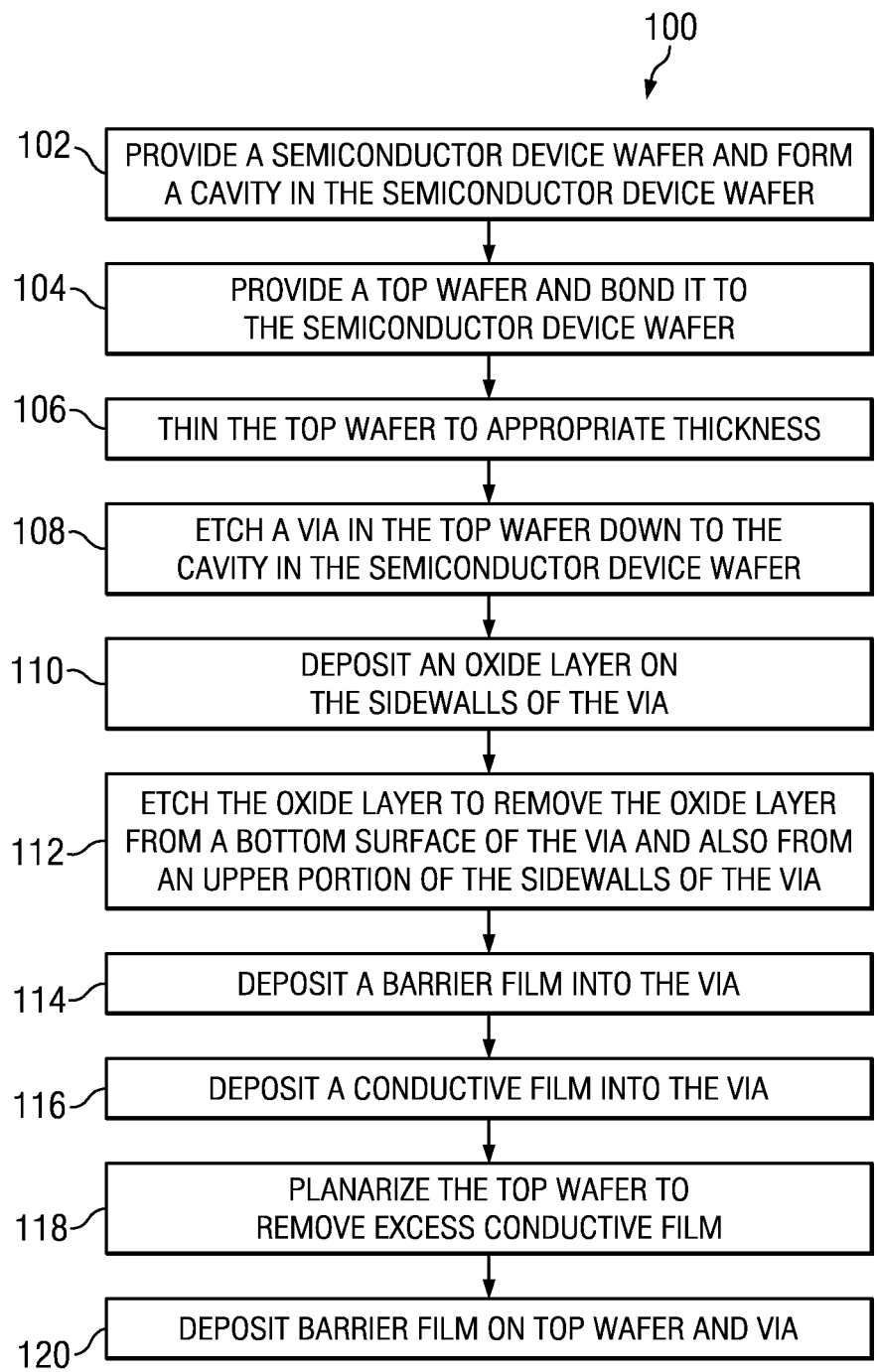
FIG. 1 is a flow chart illustrating an embodiment of a method of fabricating a semiconductor device having a high aspect ratio via.

The present disclosure relates generally to semiconductor manufacturing. Specifically, the present disclosure relates to metallization of integrated circuit semiconductor devices. More specifically, the present disclosure relates to semiconductor devices having an improved high aspect ratio via and a method of fabricating the same. In an embodiment, the present disclosure provides a system for fabricating vias in semiconductor devices, where one or more oxide layers are deposited (e.g., using chemical vapor deposition (CVD)) into the deep via. A pre treatment process (e.g., Ar sputtering or wet clean process) may be performed to the via before barrier deposition to remove native oxide. An oxide etching process (e.g., a dry etching process) is used to remove the oxide except along the via sidewall and to form an oxide spacer around a top corner of the via. One or more barrier layers (e.g., Ti, TiN, Ti/TiN) are deposited by CVD, Physical vapor deposition (PVD), or other suitable process. Then, tungsten (e.g., WF6) is deposited using a CVD process, such as W-CVD to fill the deep via with an electrically conductive material. A chemical-mechanical polishing process (e.g., a tungsten etchback, WCMP process) is then performed to remove excess tungsten film, except in the deep via.

Generally, conventional semiconductor vias may have conductivity problems because the electrical connection between vias may be blocked by a native oxide that forms in the via, especially along a sidewall of the via, during the via hole etching process. If the native oxide is not removed it may block electrical signals from passing. This is generally because the native oxide layer causes the electrons to travel through a via top barrier to adjacent Si to connect to a neighboring via. Accordingly, device reliability is degraded if the top barrier layer is damaged. In addition, the step coverage of a barrier layer in the bottom of the deep via is not sufficient to prevent the Si from being attacked by the WF6 during tungsten deposition into the via. This can be exaggerated if the via sidewall is damaged.

However, as should be understood by those having ordinary skill in the art, the addition of the applied oxide layer in the via of the present disclosure helps protect sidewall silicon in the via from being attacked by the WF6 during tungsten deposition. Additionally, the oxide spacer that is formed around the top corner of the via after dry etching provides an improved profile and a substantially oxide-free silicon (Si) interface for the barrier layer deposition. Furthermore, another advantage is that the WCMP process may help to form a flat and clear surface for a later-used continuous photo process.

It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure such as, nanoelectromechanical systems (NEMS) devices, application specific integrated circuit (ASIC) devices, and other such devices. Furthermore, the MEMS device structure or design illustrated is exemplary only and not intended to be limiting in any manner.

FIG. 1 is a flow chart illustrating an embodiment of a method of fabricating a semiconductor device having a high aspect ratio via. Cross-sectional views of an embodiment of such composite wafer device are shown in FIGS. 2-11 at different stages of fabrication. The present disclosure is described herein with respect to embodiments shown in FIGS. 2-11 relating to the method 100 provided in FIG. 1. The method 100 provides for a semiconductor fabrication process that fabricates a semiconductor having a high aspect ratio via. One of ordinary skill in the art would recognize additional steps that may be included in the method 100 and/or omitted from the method 100. The method 100 and the corresponding FIGS. 2-11 are exemplary only and not intended to be limiting. For example, the structure of the MEMS devices depicted in FIGS. 2-11 are exemplary only and similar methods may be used to form other devices. CMOS circuitry may be included in the device depicted in FIGS. 2-11.

Figure 2:
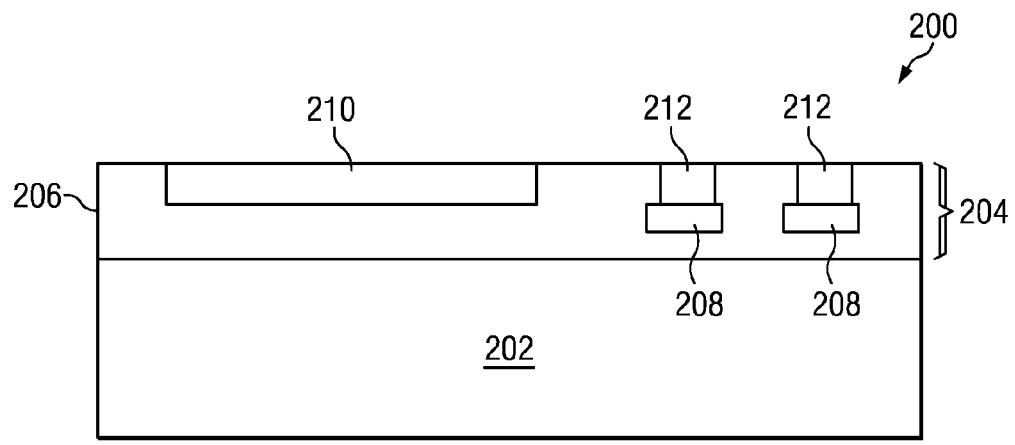
FIGS. 2-11 are cross-sectional views illustrating an embodiment of a semiconductor device according to the method of FIG. 1 at various stages of manufacture, where
Figure 3:
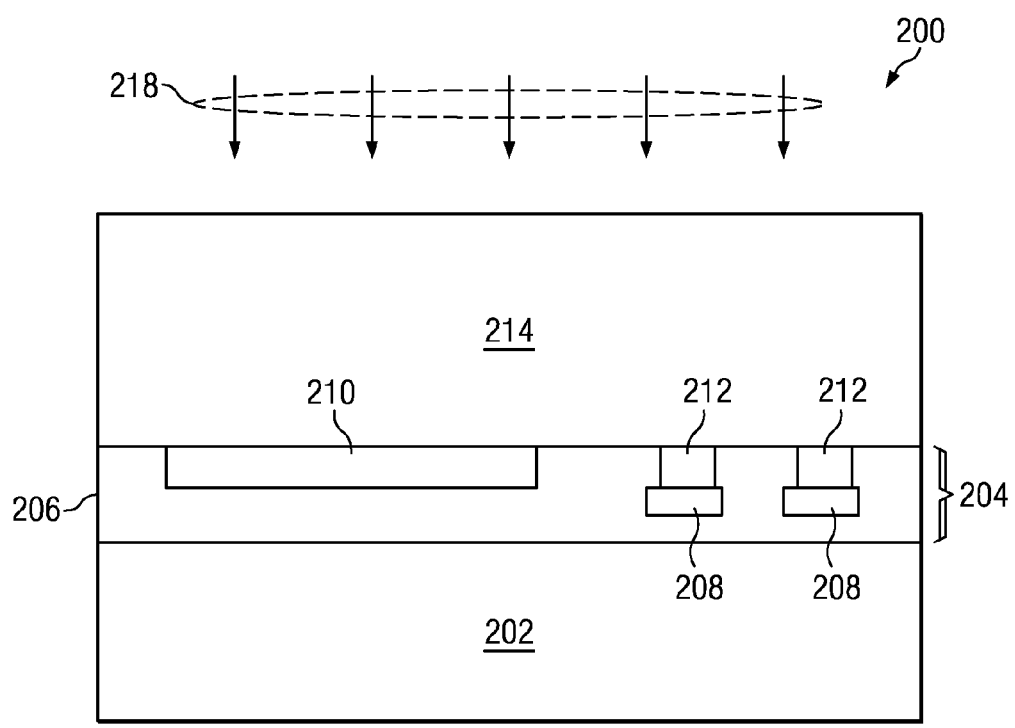
Figure 4:
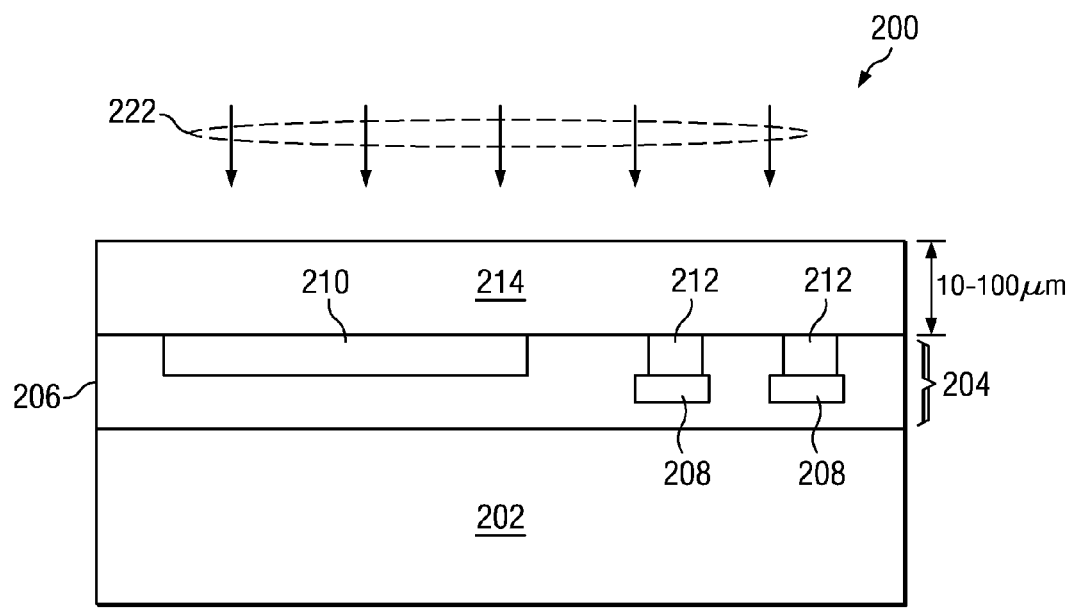

FIG. 2 is a cross-sectional view illustrating an embodiment of a semiconductor device 200 having a high aspect ratio via (e.g., via depth/via size) structure according to the method 100 of FIG. 1. The method 100 begins at block 102 where a first, semiconductor device wafer (e.g., bottom wafer 202) is provided and one or more cavities (e.g., cavities 210 and 212) are formed in the wafer 202. In an embodiment, the wafer 202 is a silicon (Si) substrate. The wafer 202 may be crystalline Si or poly Si. In alternative embodiments, the wafer 202 may include other elementary semiconductors such as germanium, or may include a compound semiconductor such as, silicon carbide, gallium arsenide, indium arsenide, and indium phosphide.

In an embodiment, the bottom wafer includes an isolation set 204 having one or more dielectric (e.g., insulator) layers 206 and one or more patterned conductor layers 208 embedded in or on the dielectric layer 206. In an embodiment, the dielectric layer 206 includes an oxide. There may be any number of dielectric layers formed on the wafer 202. The dielectric layer 206 may be silicon oxide layers formed at a thickness range of approximately 1 um to approximately 10 um. However, it is contemplated that other types and sizes of dielectric layers may be formed on the wafer 202. The dielectric layer 206 may be formed on the wafer 202 by integrated circuit (IC) processes (e.g., CMOS processes), such as bonding, depositing, growing and thermally oxidizing, chemical vapor deposition (CVD), or other methods known in the art for forming dielectric layers on a substrate 202.

Electrically conductive layer 208 is formed on the wafer 202 among the isolation set dielectric layers 206. The conductive layer 208 may be formed from a metal, such as tungsten, aluminum, copper, nickel or any other metal. In an embodiment, the electrically conductive layer 208 comprises approximately 0.5% Cu and approximately 99.5% Al. However, any electrically conductive material and combinations of materials may be used to form the conductive layer 208. In an embodiment, the electrically conductive layer 208 is formed at a thickness range of approximately 0.8 um to approximately 1.2 um. It should be understood that the conductive layer 208 may be formed using patterning, masking, deposition (e.g., physical vapor deposition) and/or any other methods now known or known in the future for forming the conductive layers on the wafer 202. In an embodiment, the conductive layer 208 is patterned connection structures. In an embodiment, conductor layer 208 may be electrically coupled to other patterned conductor layers. Also in an embodiment, the conductive layer 208 may be electrically couple to integrated circuit devices in the wafer 202. As should be understood, the isolation set 204, including the conductor layers 208 may be formed using conventional back-end IC processes for forming sequential interconnect layers and insulator layers. The electrically conductive layer 208 may include a barrier layer formed on the electrically conductive layer 208. This is shown as layer 240 in enlarged FIGS. 6-11 and described in more detail below.

The cavity 210 is formed to receive or otherwise assist operation of a MEMS device. The cavity 210 is a free space that is etched in the isolation set 204. The cavity 210 is formed by performing a wet etching process or by forming a dry plasma etching process to the isolation set 204. In an embodiment, the cavity 210 extends through a portion of the dielectric layer 206. Size dimensions for the cavity 210 may be any size to accommodate a floating structure, such as, a MEMS device formed above the cavity 210.

The cavities 212 are formed to become portions of a via for communicating electrical signals through various layers of the device 200. The cavities 212 are free spaces that are etched in the isolation set 204. The cavities 212 are formed by performing a wet etching process or by forming a dry plasma etching process to the isolation set 204. In an embodiment, the cavities 212 extend through a portion of the dielectric layer 206 to the conductor layer 208. Size dimensions for the cavities 212 may be any size to accommodate a conductive via formed therein, as described in more detail below.

As should be understood, one or more isolation features (not shown) may be formed in the wafer 202. The wafer 202 may also include one or more integrated circuit devices (not shown), such as CMOS devices, (e.g., NMOS and/or PMOS transistors). The wafer 202 may further include circuitry associated with the transistors such as interconnect layers (e.g., metal lines and vias), interlayer dielectric layers (ILD), and/or inter-metal dielectric layers (IMD).

The method 100 proceeds to block 104 (FIG. 3) where a second wafer (e.g., the top wafer 214) is provided and bonded to the isolation set 204 of the bottom wafer 202. In an embodiment, the top wafer 214 is a low-resistance doped silicon wafer. In an embodiment, the wafer 214 has a resistivity less than 1 ohm-cm. In an embodiment, the wafer 202 may include a silicon on insulator (SOI) substrate.

The second wafer 214 is bonded to the isolation set 204 using a low temperature fusion bonding process 218. Because the first wafer 202 includes conductor layer 208 and dielectric layer 206, the bonding temperature range for bonding the second wafer 214 should be from room temperature and should not exceed approximately 400 C to avoid damaging components of the device 200. Accordingly, the present disclosure provides a low temperature bonding of first and second wafers (e.g., wafers 202 and 214) to create a composite wafer structure semiconductor device. To accomplish the bonding, a set of cleaning processes may be performed on both the first wafer 202 structure (e.g., including the isolation set 204) and the second wafer 214 before the bonding. In an embodiment, the cleaning processes may include one or more CMP processes to planarize the surfaces to be bonded. Before bonding, the wafers are cleaned by a water scrub process and dipped in HF for removal of surface oxide layer. Then, a surface plasma treatment is applied to create a hydrophilic surface in nitrogen and/or oxygen plasma environment. The two wafers are then placed in contact with one another with a point force at the center point to generate an initial bond point. A bond force of larger than 1 N and a post anneal temperature of larger 200 C can be applied to get a good bond strength. In an embodiment, the bond chamber has atmospheric pressure. However, in another embodiment, a vacuum chamber may be used as a bonding chamber. In an embodiment, the second wafer 214 covers and hermetically seals the cavity 210, however, this is optional.

The method 100 then proceeds to block 106 (FIG. 4) where the top wafer 214 is thinned to an appropriate thickness to form a floating structure, such as a MEMS device. The floating structure, in whole or in part, is formed in the second wafer 214 over the cavity 210. The MEMS device may include a plurality of elements formed on metal, polysilicon, dielectric, and/or other materials. The MEMS device may include materials typically used in a conventional CMOS fabrication process. Any configuration of MEMS device may be possible, depending on the desired functionality. One or more of the elements depicted may be designed to provide MEMS mechanical structures of the MEMS device. The MEMS mechanical structures may include structures or elements operable for mechanical movement. The MEMS device may be formed using typical processes used in CMOS fabrication, for example, photolithography, etching processes (e.g., wet etch, dry etch, plasma etch), deposition processes, plating processes, and/or other suitable processes. In an embodiment, the MEMS device may be a motion sensor (e.g., a gyroscope, an accelerometer, etc.), a radio frequency (RF) MEMS device (e.g., an RF switch, filter, etc.), an oscillator, or any other MEMS type device. Various sizes of MEMS devices are contemplated. Because wafer 214 is bonded to the isolation set 204, the MEMS device may be formed before and/or after the bonding process 218. Thus, in an embodiment, after the bonding process 218, the wafer 214, originally approximately 725 um thick, is thinned to a pre-defined thickness of approximately 30 um. Thickness range for the thinned wafer 214 may be a thickness range of approximately 10 um to approximately 100 um. The thinning process 222 may include CMOS processes of grinding, polishing (e.g., CMP), etching, or other suitable thinning steps.

The wafer 214 is thinned to a predefined thickness, such as approximately 10 um to approximately 100 um, based on desired application for the device. A portion of the floating structure will interact with outside perturbation, such as temperature variation, inertial movement, pressure changes, and/or other electrical, magnetic, or optical parameter measurements. In an embodiment, when the device 200 is exposed to a pressure change, the floating structure/membrane will deform inward or outward and thus, a sensing signal will be created to indicate a pressure change. It is noted that the portions of the second wafer 214 may also include one or more circuit devices (not shown), such as transistors (e.g., NMOS and/or PMOS transistors). The second wafer 214 may also include circuitry associated with the transistors, such as interconnect layers (e.g., metal lines and vias) and interlayer dielectric layers (ILD).

The method 100 next proceeds to block 108 (FIG. 5) where one or more vias 230 are etched in the silicon of the top wafer 214 to combine with the cavities 212 in the semiconductor wafer 202. To form the vias 230, one or more channels are formed to extend through wafer 214 to the cavities 212 in the isolation set 204 to the conductive layer 208. Any method for forming channels (e.g., masking and etching) may be used to form the vias 230. The via 230 may be formed in the silicon of the top wafer using a deep plasma dry via etch process. In an embodiment, the via width dimension 232 is larger than the cavity width dimension 234. The via hole etching may have a high-aspect-ratio (HAR)>4. A HAR is generally defined from a via depth divided by the via size. A HAR may range from a value of 4 to a value of 12.

Figure 5:
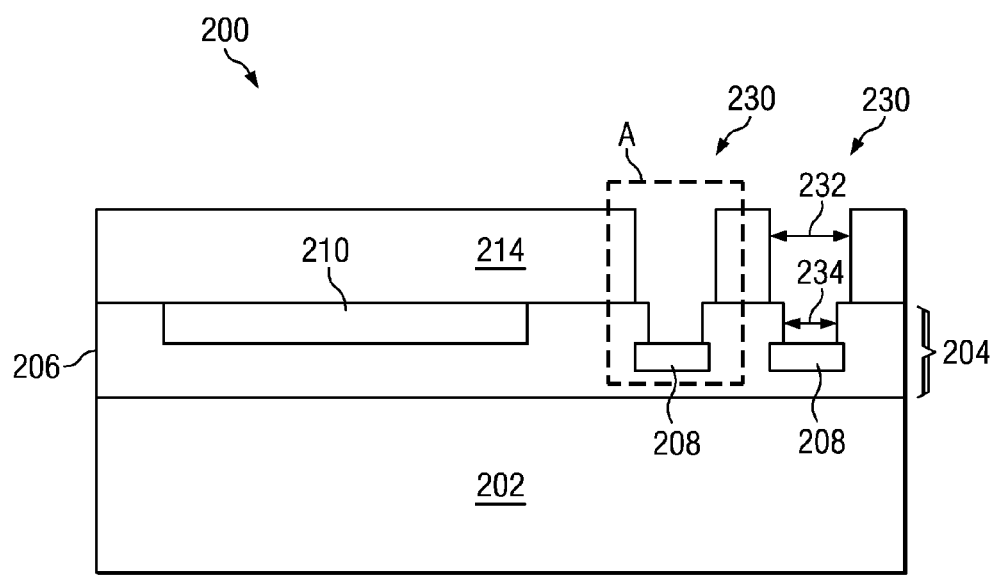
Figure 7:
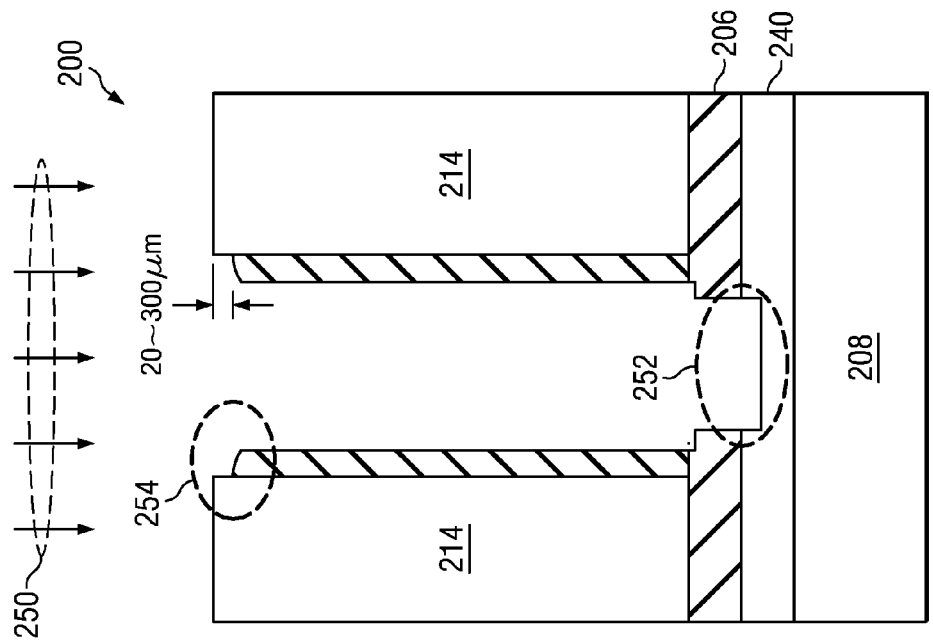
Figure 6:
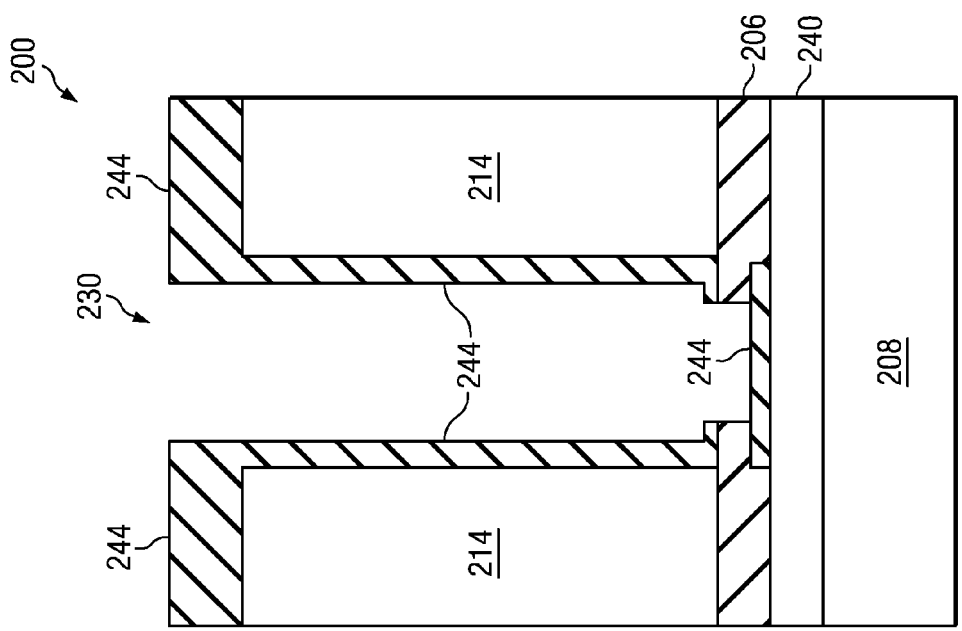
Figure 9:
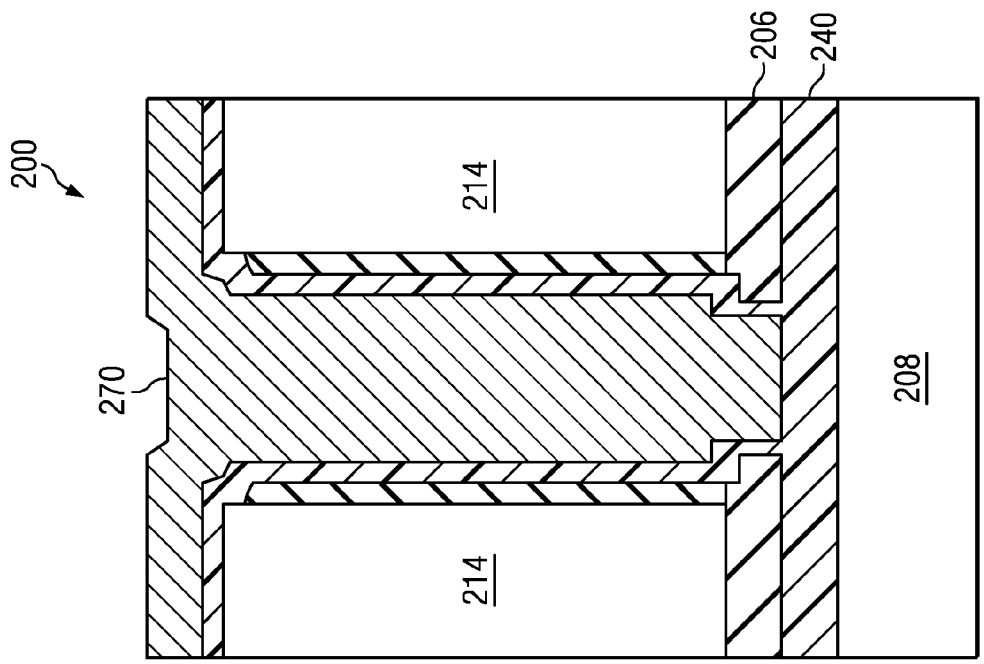

For clarity, remaining figures, FIGS. 6-11, are shown as enlarged portions relating to the area of block A shown in FIG. 5. As mentioned above, the conductor layer 208 may include a barrier layer 240 over the conductor layer 208. In an embodiment, the barrier layer 240 is Ti, TiN, Ta, TaN, or other suitable barrier layer material. The barrier layer may be formed using a physical vapor deposition (PVD) process or other suitable deposition process to have a thickness range of approximately 150 angstrom to approximately 200 angstrom.

The method 100 then proceeds to block 110 (FIG. 6) where an oxide layer (e.g., oxide layer 244) is formed on the wafer 214 and in the via 230 to protect the Si sidewalls of the via 230 from being damaged during a WF6 deposit process, to form conductors in the via 230. Formation of the conductors in the via 230 is described in more detail below. The oxide layer 244 is formed using a CVD process forming the oxide layer to a thickness range of approximately 0.1 um to approximately 2 um on the inner sidewalls of the via 230. However, any suitable thickness of oxide 244 may be formed in the via 230. Various CVD processes may be used to form the oxide layer 244, such as low pressure CVD (LPCVD), atmospheric pressure CVD (APCVD), sub-atmospheric CVD (SACVD), high-density plasma CVD (HDPCVD), atomic layered deposition CVD (ALDCVD), plasma enhanced CVD (PECVD), or other suitable CVD process. SACVD processing below one atmosphere of pressure provides good coverage of the sidewalls of the via 230 with the oxide 244. In an embodiment, the oxide layer 244 is the same material as the dielectric layer 206, such as silicon oxide.

After forming the oxide layer 244 in the via 230, the method 100 proceeds to block 112 (FIG. 7) where the oxide layer 244 is etched using an etch process 250 to remove the oxide layer from a bottom surface 252 of the via 230 and also from an upper portion of the sidewalls of the via 230. As should be understood, a blanket oxide dry etching process may be used to remove all or substantially all of the oxide layer 244, except along the inner sidewalls of the via 230. As such, the oxide layer is formed to shape a button/shoulder 254 at an upper portion of the via 230. A button/shoulder may also be formed at the bottom 252 of the via 230. In an embodiment, the step height between the top of the remaining oxide layer 244 and the top surface of the Si of the top wafer 214 is a range of approximately 20 nm to approximately 300 nm.

Figure 8:
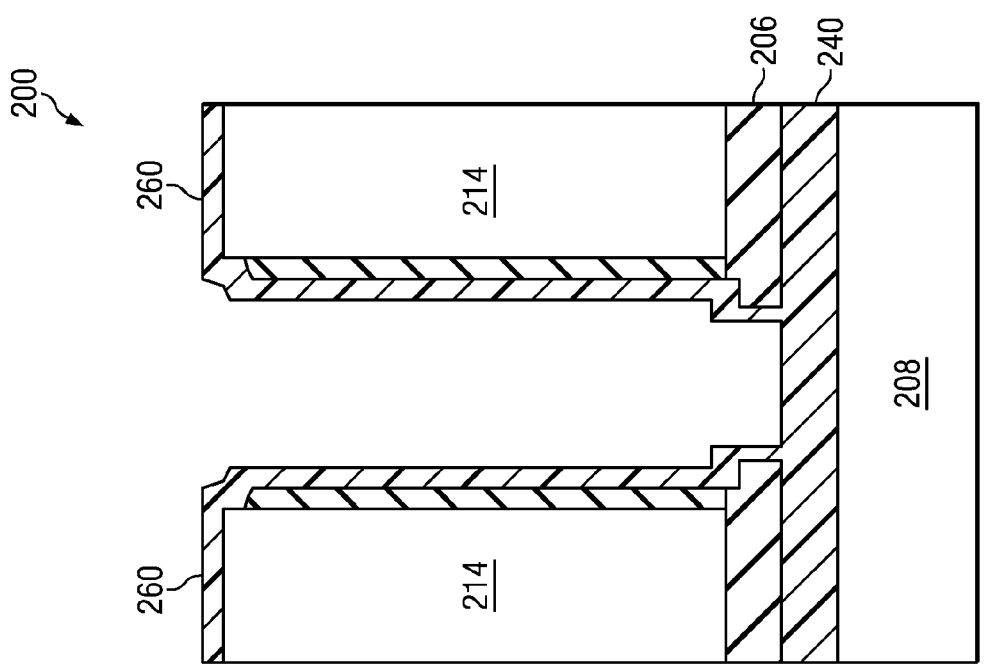
Figure 10:
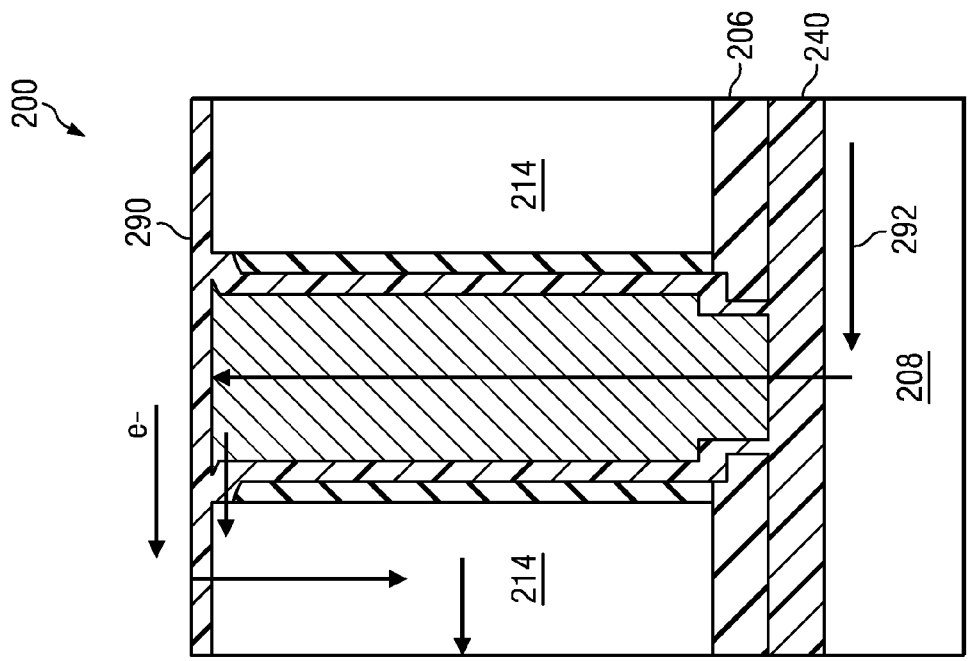
Figure 11:
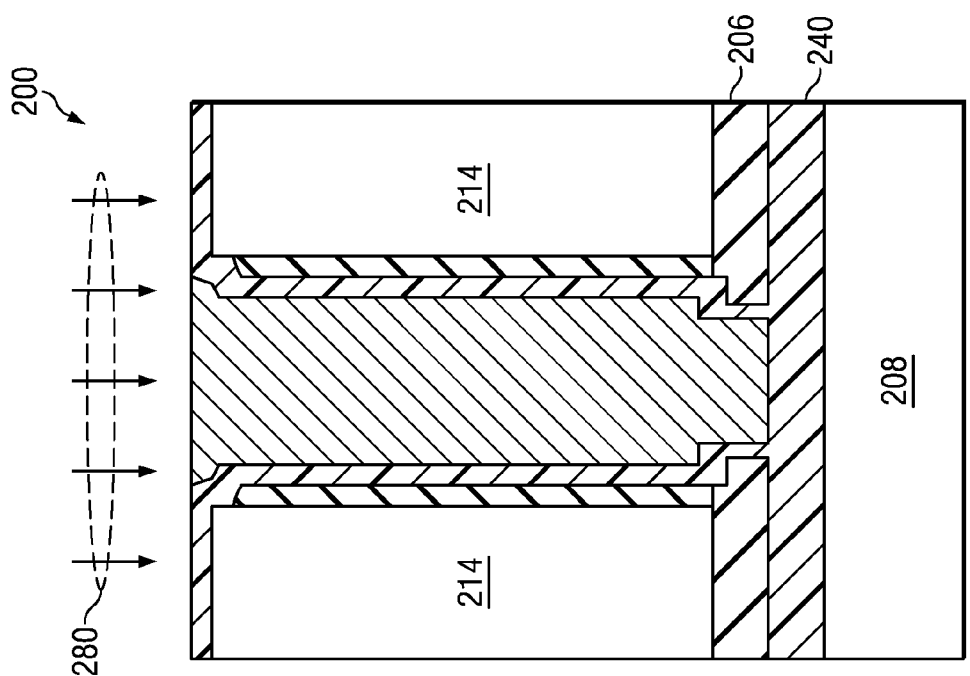

The method 100 then proceeds to block 114 (FIG. 8) where a barrier film layer 260 is deposited into the via 230. As shown in FIG. 8, the barrier film layer 260 generally covers the inner walls of the via 230 just inside of the oxide layer 244 and also along the shoulders 254. In an embodiment, the barrier layer 260 comprises Ti formed using a PVD or CVD process to a thickness range of approximately 50 angstrom to approximately 300 angstrom. In an alternative embodiment, the barrier layer 260 comprises TiN formed using either a CVD process or a PVD process to a thickness range of approximately 50 angstrom to approximately 1000 angstrom. The barrier film layer 260 may comprise the same material as the barrier layer 240. A pre-treatment cleaning process may be applied to the via 230 to remove native oxide in the bottom 252 and shoulder 254 areas. The pre-treatment process may include argon (Ar) sputtering or wet cleaning. In various other embodiments, the barrier film layer 260 may be deposited using sputtering, CVD, or ALD.

The method 100 proceeds next to block 116 where the via 230 is filled with a conductive filler film 270. The conductive filler 270 is a conductive material, such as tungsten (W). The conductive filler 270 may be deposited using a tungsten deposition process, such as a CVD process at a temperature range of approximately 400 C to approximately 450 C. An embodiment, uses a precursor, such as, WF6, SiH4, H2, or other suitable material to cause the tungsten fluoride to react with the hydrogen. The conductive filler 270 may be formed to a thickness of approximately 0.5 um to approximately 5 um above the top surface of the top wafer 214. However, other thicknesses of filler 270 may be used with the present disclosure. Other materials may be used for the conductive filler 270, such as aluminum, copper, nickel or other conductive metals. However, any electrically conductive substance may be used to form the conductive filler 270. The conductive filler 270 may be formed using patterning, masking, deposition (e.g., physical vapor deposition (PVD), chemical vapor deposition (CVD)) and/or any other methods now known or known in the future for forming the conductive filler 270.

The method 100 then proceeds to block 118 where a process 280, such as a CMP process, is performed on the conductive layer 270 to remove excess material. The CMP process removes excess conductive film 270 and a portion of the barrier layer 260 down to a top surface of the top wafer 214 (e.g., Si wafer).

The method 100 then proceeds to block 120 where a top barrier film layer 290 is formed on the top surface of the top wafer 214 and the via 230. In an embodiment, the barrier layer 290 comprises Ti formed using a PVD or CVD process to a thickness range of approximately 50 angstrom to approximately 300 angstrom. In an alternative embodiment, the barrier layer 290 comprises TiN formed using either a CVD process or a PVD process to a thickness range of approximately 50 angstrom to approximately 1000 angstrom. The barrier film layer 290 may comprise the same material as the barrier layer 240 and the barrier layer 260. In various other embodiments, the barrier film layer 290 may be deposited using sputtering, CVD, or ALD. As should be understood, the barrier layer 290 assists in electron flow to make an electrical connection between the via 230 and the low resistance silicon of the top wafer 214. An embodiment of the electron flow is shown as arrows 292.

As should be understood, a floating structure (e.g., MEMS device) formed in the top wafer 214 may be electrically connected to the conductor layer 208 by the via conductor 270. In an embodiment, the aspect ratio of this via hole 230 is larger than 5. In an embodiment, the via conductor 232 may be a stacking structure including different material layers to achieve a good, low contact resistance. Such material layers may include Ti, TiN, Al, W, or other similar materials. Using one or more vias 230, the floating structure may also be electrically connected to IC devices in the bottom wafer 202 and the perturbation can be transferred to a measurable electrical signal via processing of the IC devices. Other processes may be performed on the device to package the device and provide outside connections with elements formed in the device 200.

The present disclosure provides for different embodiments of a semiconductor device having a high aspect ratio via and methods of fabricating the same. In one embodiment, the present disclosure provides a semiconductor device having a substrate wafer, a dielectric layer formed on the substrate wafer, a patterned conductor layer formed in the dielectric layer, and a first barrier layer formed on the conductor layer in the dielectric layer. A silicon top wafer is bonded to the dielectric. A via is then formed through the top wafer and through a portion of the dielectric layer to the first barrier layer. The via along the dielectric layer is narrower than the via along the top wafer. A via sidewall dielectric layer is formed along inner walls of the via adjacent the top wafer to a distance below an upper surface of the top wafer, thereby forming an upper sidewall dielectric layer shoulder. A via sidewall barrier layer is formed inward of the via sidewall dielectric layer to line the via from the first barrier layer to the upper surface of the top wafer. A conductive layer then fills the via inward of the via sidewall barrier layer. A top barrier layer is then formed on the conductive layer, the sidewall barrier layer, and the top wafer.

In another embodiment, the present disclosure provides a microelectromechanical system (MEMS) device. The MEMS device includes a substrate wafer, a dielectric layer formed on the substrate wafer, a patterned conductor layer formed in the dielectric layer, and a first barrier layer formed on the conductor layer in the dielectric layer. A silicon top wafer is bonded to the dielectric layer. A first portion of the silicon top wafer is configured as a MEMS sensor. A via is formed through a second portion of the top wafer and through a portion of the dielectric layer to the first barrier layer. A via sidewall dielectric layer is formed along inner walls of the via adjacent the top wafer to a distance below an upper surface of the top wafer, thereby forming an upper sidewall dielectric layer shoulder. A via sidewall barrier layer is formed lining the via from the first barrier layer to the upper surface of the top wafer, the via sidewall barrier layer inward of the via sidewall dielectric layer. A conductive layer fills the via inward of the via sidewall barrier layer. A top barrier layer is then formed on the conductive layer, the sidewall barrier layer, and the top wafer.

In yet another embodiment, the present disclosure provides a method of forming a via in a semiconductor device. The method includes providing a semiconductor wafer and forming a cavity in the semiconductor wafer. The method also includes providing a top wafer and bonding the top wafer to the semiconductor wafer. Then, the method includes etching a via through the top wafer to the cavity and depositing an oxide layer on sidewalls of the via. After depositing the oxide layer on the sidewalls of the via, the method includes etching the oxide layer to remove the oxide layer from a bottom surface of the via and also from an upper portion of the sidewalls of the via. A barrier film is deposited in the via, inward of the oxide layer. Then, the method includes filling the via with a conductive film and depositing a top barrier film on the top wafer, the oxide layer, the barrier film, and the conductive film.

The foregoing has outlined features of several embodiments so that those skilled in the art may better understand the detailed description as provided herein. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A via structure comprising:
a via having via sidewall surfaces defined by a semiconductor substrate, wherein the via sidewall surfaces have a first portion and a second portion;
a conductive layer disposed in the via on the first portion of the via sidewall surfaces; and
a dielectric layer disposed in the via on the second portion of the via sidewall surfaces, wherein the dielectric layer is disposed between the second portion of the via sidewall surfaces and the conductive layer,
wherein the via extends through the semiconductor substrate and into another semiconductor substrate, wherein a width of the conductive layer disposed in the semiconductor substrate is greater than a width of the conductive layer disposed in the another semiconductor substrate, wherein an interface between the conductive layer and the first portion of the via sidewall surfaces is free of oxide.

2. The via structure of claim 1 wherein:
the via sidewall surfaces extend through the semiconductor substrate from a first surface of the semiconductor substrate to a second surface of the semiconductor substrate;
the conductive layer extends through the semiconductor substrate from the first surface to the second surface; and
the first portion of the via sidewall surfaces has a step height, the step height being a length of the first portion of the via sidewall surfaces between the first surface of the semiconductor substrate and the dielectric layer.

3. The via structure of claim 2 further including:
the another semiconductor substrate that includes an interconnection structure, wherein the conductive layer further extends from the second surface of the semiconductor substrate into the another semiconductor substrate to a conductive interconnect layer of the interconnection structure, wherein the conductive interconnect layer defines a via bottom surface.

4. The via structure of claim 3 wherein:
the semiconductor substrate is a MEMS substrate;
the another semiconductor substrate is a CMOS substrate; and
the via structure electrically couples the CMOS substrate to the MEMS substrate.

5. The via structure of claim 3 wherein an interface between the conductive layer and the conductive interconnect layer is free of oxide.

6. The via structure of claim 1 wherein the dielectric layer is an oxide layer.

7. The via structure of claim 1 wherein the conductive layer includes a conductive via layer surrounded by a conductive barrier layer, wherein an interface of the conductive barrier layer and the first portion of the via sidewall surfaces is free of oxide.

8. The via structure of claim 7 wherein the conductive via layer includes a tungsten-containing material and the conductive barrier layer includes a titanium-containing material.

9. The via structure of claim 1 wherein:
the semiconductor substrate is a silicon substrate; and
wherein the dielectric layer includes an oxide layer that is a chemical vapor deposition (CVD) oxide layer.

10. An integrated circuit device comprising:
a first substrate, the first substrate includes an interconnection structure that includes a conductive interconnect layer;
a second substrate bonded to the first substrate; and
a via structure that electrically couples the first substrate to the second substrate, wherein the via structure includes:
via sidewall surfaces defined by the second substrate, the via sidewall surfaces extending through the second substrate from a top surface of the second substrate to a bottom surface of the second substrate, the bottom surface of the second substrate being bonded to the first substrate, wherein the via sidewall surfaces have a first portion and a second portion;
a conductive layer disposed in the second substrate between the via sidewall surfaces, the conductive layer extending through the second substrate from the top surface to the bottom surface, wherein the conductive layer is disposed on the first portion of the via sidewall surfaces, the conductive layer is partially disposed in the first substrate, such that the conductive layer further extends from the bottom surface of the second substrate into the first substrate to the conductive interconnect layer, wherein the conductive interconnect layer defines a via bottom surface, wherein a width of the conductive layer disposed in the second substrate is greater than a width of the conductive layer disposed in the first substrate; and
an oxide layer disposed between the second portion of the via sidewall surfaces and the conductive layer.

11. The integrated circuit device of claim 10 wherein:
the first substrate is a CMOS substrate; and
the second substrate is a MEMS substrate.

12. The integrated circuit device of claim 10 wherein the interconnection structure further includes a dielectric layer, the conductive interconnect layer being disposed in the dielectric layer, and further wherein other via sidewall surfaces of the via structure are defined by the dielectric layer, the other via sidewall surfaces being between the via sidewall surfaces defined by the second substrate and the via bottom surface of the via structure.

13. The integrated circuit device of claim 10 wherein an interface between the conductive layer and the conductive interconnect layer is free of oxide.

14. The integrated circuit device of claim 10 wherein a length of the first portion of the via sidewall surfaces extends from the top surface of the second substrate to the oxide layer.

15. The integrated circuit device of claim 10 wherein the conductive layer includes a conductive via layer surrounded by a conductive barrier layer, wherein an interface between the conductive barrier layer and the first portion of the via sidewall surfaces is free of oxide.

16. The integrated circuit device of claim 15 wherein the conductive via layer includes a tungsten-containing material and the conductive barrier layer includes a titanium-containing material.

17. The integrated circuit device of claim 10, wherein an interface between the conductive layer and the first portion of the via sidewall surfaces is free of oxide.

18. An integrated circuit device comprising:
- a CMOS substrate that includes an interconnection structure that includes a conductive interconnect layer disposed in an insulator layer;
- a MEMS substrate having a first surface and a second surface opposite the first surface, the second surface being bonded to the CMOS substrate; and
- a via structure disposed in the CMOS substrate and the MEMS substrate, wherein the via structure electrically couples the CMOS substrate and the MEMS substrate, and further wherein the via structure includes:
  - a via sidewall surface defined by the MEMS substrate, the via sidewall surface extending through the MEMS substrate from the first surface to the second surface,
  - a via sidewall surface defined by the insulator layer,
  - a via bottom surface defined by the conductive interconnect layer, wherein the via sidewall surface defined by the insulator layer extends between the via bottom surface and the via sidewall surface defined by the MEMS substrate,
  - a conductive layer disposed in the MEMS substrate and the CMOS substrate, the conductive layer extending through the MEMS substrate from the first surface to the conductive interconnect layer, wherein the conductive layer is disposed over the via sidewall surface defined by the MEMS substrate, the via sidewall surface defined by the insulator layer, and the via bottom surface; and
  - an oxide layer disposed between the conductive layer and a portion of the via sidewall surface defined by the MEMS substrate, wherein:
    - an interface between the conductive layer and the via bottom surface is free of oxide; and
    - an interface between the conductive layer and the via sidewall surface defined by the MEMS substrate is free of oxide.

19. The integrated circuit device of claim 18 wherein a width of the conductive layer disposed in the MEMS substrate is greater than a width of the conductive layer disposed in the CMOS substrate.

* * * * *